United States Patent
Rumreich

(10) Patent No.: US 7,321,399 B2
(45) Date of Patent: Jan. 22, 2008

(54) MULTIPLEXED ANALOG-TO-DIGITAL CONVERTER ARRANGEMENT

(75) Inventor: Mark Francis Rumreich, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 344 days.

(21) Appl. No.: 10/498,071

(22) PCT Filed: Dec. 6, 2002

(86) PCT No.: PCT/US02/39258

§ 371 (c)(1),
(2), (4) Date: Jun. 9, 2004

(87) PCT Pub. No.: WO03/055207

PCT Pub. Date: Jul. 3, 2003

(65) Prior Publication Data

US 2004/0257465 A1  Dec. 23, 2004

Related U.S. Application Data

(60) Provisional application No. 60/339,544, filed on Dec. 11, 2001.

(51) Int. Cl.
*H03M 1/12* (2006.01)

(52) U.S. Cl. ............... 348/572; 348/573; 348/720; 341/155; 341/141

(58) Field of Classification Search ............... 348/572, 348/573, 575, 571, 582, 651, 660, 720, 423.1; 341/155, 144, 141, 126
See application file for complete search history.

(56) References Cited

U.S. PATENT DOCUMENTS 4,345,241 A * 8/1982 Takeuchi et al. ............ 341/118

(Continued)

FOREIGN PATENT DOCUMENTS

EP  0797353  9/1997

(Continued)

OTHER PUBLICATIONS

Patent Abstracts of Japan, vol. 013, No. 201, May 12, 1989, & JP 1-022181 (See Reference AE).

(Continued)

*Primary Examiner*—David Ometz
*Assistant Examiner*—Jean W. Désir
(74) *Attorney, Agent, or Firm*—Joseph J. Laks; Robert D. Shedd; Catherine A. Ferguson

(57) ABSTRACT

A system such as an audio and/or video system includes a multiplexed analog-to-digital converter arrangement. The arrangement includes an ADC for converting first and second analog signals to first and second digital signals, respectively, and for outputting the first digital signal during a first time interval and outputting the second digital signal during a second time interval. A digital filter is provided for filtering the first and second digital signals to generate first and second filtered signals, respectively, and for outputting the first and second filtered signals in a time-aligned manner during a third time interval.

18 Claims, 3 Drawing Sheets

U.S. PATENT DOCUMENTS

| | | | |
|---|---|---|---|
| 5,459,528 A | 10/1995 | Pettitt | |
| 5,546,133 A * | 8/1996 | Honma | 348/642 |
| 5,576,770 A * | 11/1996 | Rumreich | 348/525 |
| 5,691,821 A * | 11/1997 | Hieda et al. | 348/217.1 |
| 5,831,689 A * | 11/1998 | Boie | 348/725 |
| 5,838,385 A | 11/1998 | Reder et al. | |
| 5,889,562 A * | 3/1999 | Pau | 348/447 |
| 5,969,654 A * | 10/1999 | Goldin | 341/141 |
| 6,191,823 B1 * | 2/2001 | Ahn | 348/554 |
| 6,448,920 B1 * | 9/2002 | Webster et al. | 341/155 |
| 6,466,615 B1 * | 10/2002 | Song | 375/232 |
| 6,522,274 B1 * | 2/2003 | Amar et al. | 341/141 |
| 6,522,282 B1 * | 2/2003 | Elbornsson | 341/155 |
| 6,522,359 B1 * | 2/2003 | Yamashita | 348/312 |
| 6,943,714 B2 * | 9/2005 | White | 341/141 |

FOREIGN PATENT DOCUMENTS

| | | |
|---|---|---|
| GB | 1575148 | 9/1980 |
| JP | 1-22181 | 1/1989 |

OTHER PUBLICATIONS

Search Report dated Mar. 10, 2003.

* cited by examiner

MULTIPLEXED ANALOG-TO-DIGITAL CONVERTER ARRANGEMENT

This application claims the benefit, under 35 U.S.C. § 365 of International Application PCT/US02/39258, filed Dec. 6, 2002, which was published in accordance with PCT Article 21(2) on Jul. 3, 2002 in English and which claims the benefit of U.S. Provisional patent application No. 60/339,544, filed Dec. 11, 2001.

The present invention generally relates to signal processing in systems such as video and/or audio systems, and more particularly, to an arrangement for time sharing an analog-to-digital converter ("ADC") in such systems that provides, among other things, time-alignment among output signals.

Time sharing an ADC for multiple input signals is a well-known way to reduce the number of ADCs in a system, such as a video and/or audio system. One technique for sharing an ADC in such systems involves simple multiplexing. FIG. 1, for example, illustrates a multiplexed ADC arrangement 100 employing simple multiplexing. In FIG. 1, a multiplexer 120 simultaneously receives analog U and V input signals, and is switched in dependence upon an enable ("EN") signal to output selected ones of the received analog U and V signals in an alternating manner. An ADC 130 receives the analog U and V output signals from multiplexer 120, and digitizes the received U and V signals in dependence upon a clock ("CLK") signal, wherein each interval of the CLK signal defines a single clock cycle or time interval. In FIG. 1, the frequency of the CLK signal may, for example, be two times the frequency of the EN signal. A demultiplexer 140 receives the digital U and V signals output from ADC 130, and is switched in dependence upon the EN signal to output the digital U and V signals. Table 1 below illustrates an exemplary operation of multiplexed ADC arrangement 100.

TABLE 1

|  | Clock Cycle | | | | |
| --- | --- | --- | --- | --- | --- |
|  | 1 | 2 | 3 | 4 | 5 |
| Analog U | 45 | 46 | 47 | 48 | 49 |
| Analog V | 75 | 76 | 77 | 78 | 79 |
| Mux Position | U | V | U | V | U |
| ADC Output | 45 | 76 | 47 | 78 | 49 |
| Demuxed U | 45 | 45 | 47 | 47 | 49 |
| Demuxed V | — | 76 | 76 | 78 | 78 |

As indicated in Table 1, the U and V output signals from demultiplexer 140 (i.e., Demuxed U/Demuxed V) are not time-aligned relative to the corresponding input signals to multiplexer 120 (i.e., Analog U/Analog V), but rather are staggered in time. In other words, there is no clock cycle where the U and V output signals from demultiplexer 140 are time-aligned relative to the corresponding input signals to multiplexer 120. Note that for purposes of example and explanation, Table 1 depicts no signal delay through ADC 130 and demultiplexer 140. Also note in Table 1 that demultiplexer 140 produces both a U output signal and a V output signal during each clock cycle. One of these U and V output signals is a signal provided from ADC 130 during the current clock cycle, while the other of these U and V signals was provided from ADC 130 during a previous clock cycle.

For many applications, the lack of time-alignment between output signals, as represented in Table 1, poses no problem. In some systems, however, such time-alignment is necessary. For example, certain digital video systems having an integrated circuit ("IC") for providing a picture-in-picture ("PIP") function may require time-alignment between output signals.

One technique for providing time-alignment between output signals involves placing an analog sample-and-hold circuit in the signal path prior to the multiplexer that provides inputs to the ADC. FIG. 2, for example, illustrates a multiplexed ADC arrangement 200 employing a sample-and-hold circuit. In FIG. 2, a sample-and-hold circuit 210 receives and holds analog U and V signals until the next EN signal. A multiplexer 220 simultaneously receives the held analog U and V signals from sample-and-hold circuit 210, and is switched in dependence upon the EN signal to output selected ones of the received analog U and V signals in an alternating manner. An ADC 230 receives the analog U and V output signals from multiplexer 220, and digitizes the received U and V signals in dependence upon the CLK signal, wherein each interval of the CLK signal defines a single clock cycle or time interval. In FIG. 2, the frequency of the CLK signal may, for example, be two times the frequency of the EN signal. A demultiplexer 240 receives the digital U and V signals output from ADC 230, and is switched in dependence upon the EN signal to output the digital U and V signals. Table 2 below illustrates an exemplary operation of multiplexed ADC arrangement 200.

TABLE 2

|  | Clock Cycle | | | | |
| --- | --- | --- | --- | --- | --- |
|  | 1 | 2 | 3 | 4 | 5 |
| Analog U | 45 | 46 | 47 | 48 | 49 |
| Analog V | 75 | 76 | 77 | 78 | 79 |
| S&H U | 45 | 45 | 47 | 47 | 49 |
| S&H V | 75 | 75 | 77 | 77 | 79 |
| Mux Position | U | V | U | V | U |
| ADC Output | 45 | 75 | 47 | 77 | 49 |
| Demuxed U | 45 | 45 | 47 | 47 | 49 |
| Demuxed V | — | 75 | 75 | 77 | 77 |

As indicated in Table 2, the output signals from demultiplexer 240 (i.e., Demuxed U/Demuxed V) are time-aligned on every other clock cycle. For example, in Table 2 the output signals from demultiplexer 240 are time-aligned during clock cycle 2 and clock cycle 4. Note that for purposes of example and explanation, Table 2 depicts no signal delay through ADC 230 and demultiplexer 240. Also note in Table 2 that demultiplexer 240 produces both a U output signal and a V output signal during each clock cycle. One of these U and V output signals is a signal provided from ADC 230 during the current clock cycle, while the other of these U and V signals was provided from ADC 230 during a previous clock cycle.

Although the multiplexed ADC arrangement 200 of FIG. 2 provides some degree of time-alignment, it is problematic in that sample-and-hold circuits are not available in most standard cell libraries used to rapidly design an IC. As a result, the sample-and-hold circuit is considered a "custom" analog block that must be designed for the particular IC being developed. Custom analog blocks generally require additional development time, expense and risk in IC development.

Another approach for providing time-alignment involves placing an analog delay network prior to the multiplexed ADC. FIG. 3, for example, illustrates a multiplexed ADC arrangement 300 employing an analog delay network. In FIG. 3, an analog delay network 310 receives analog U and V signals and outputs the same with one of the U and V signals being differentially delayed with respect to the other signal (e.g., for one clock cycle). A multiplexer 320 receives the analog U and V signals from analog delay network 310 (i.e. with one of the U and V signals having been delayed), and is switched in dependence upon the EN signal to output selected ones of the received analog U and V signals in an alternating manner. An ADC 330 receives the analog U and V output signals from multiplexer 320, and digitizes the received U and V signals in dependence upon the CLK signal, wherein each interval of the CLK signal defines a single clock cycle or time interval. In FIG. 3, the frequency of the CLK signal may, for example, be two times the frequency of the EN signal. A demultiplexer 340 receives the digital U and V signals output from ADC 330, and is switched in dependence upon the EN signal to output the digital U and V signals. Table 3 below illustrates the operation of multiplexed ADC arrangement 300.

TABLE 3

|  | Clock Cycle | | | | |
| --- | --- | --- | --- | --- | --- |
|  | 1 | 2 | 3 | 4 | 5 |
| Analog U | 45 | 46 | 47 | 48 | 49 |
| Analog V | 75 | 76 | 77 | 78 | 79 |
| Delay Network U | 45 | 46 | 47 | 48 | 49 |
| Delay Network V | — | 75 | 76 | 77 | 78 |
| Mux Position | U | V | U | V | U |
| ADC Output | 45 | 75 | 47 | 77 | 49 |
| Demuxed U | 45 | 45 | 47 | 47 | 49 |
| Demuxed V | — | 75 | 75 | 77 | 77 |

As indicated in Table 3, the output signals from demultiplexer 340 (i.e., Demuxed U/Demuxed V) are identical to the output signals produced from demultiplexer 240 in FIG. 2. That is, the output signals from demultiplexer 340 are time-aligned on every other clock cycle. For example, in Table 3 the output signals from demultiplexer 340 are time-aligned during clock cycle 2 and clock cycle 4. Note that for purposes of example and explanation, Table 3 depicts no signal delay through ADC 330 and demultiplexer 340. Also note in Table 3 that demultiplexer 340 produces both a U output signal and a V output signal during each clock cycle. One of these U and V output signals is a signal provided from ADC 330 during the current clock cycle, while the other of these U and V signals was provided from ADC 330 during a previous clock cycle.

Although multiplexed ADC arrangement 300 of FIG. 3 also provides some degree of time-alignment, it is problematic in that the difference in magnitude and group delay characteristics between the two input paths can introduce undesirable differential frequency response effects. This problem is made worse by variations due to component tolerances.

Accordingly, there is a need for a multiplexed ADC arrangement that avoids the aforementioned problems, and provides time-aligned (i.e., co-located) output signals. The present invention addresses these and other issues.

In accordance with the present invention, a system such as an audio and/or video system includes a multiplexed ADC arrangement. The arrangement includes an ADC for converting first and second analog signals to first and second digital signals, respectively, and for outputting the first digital signal during a first time interval and outputting the second digital signal during a second time interval. A digital filter is provided for filtering the first and second digital signals to generate first and second filtered signals, respectively, and for outputting the first and second filtered signals in a time-aligned manner during a third time interval.

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

Figure 1:
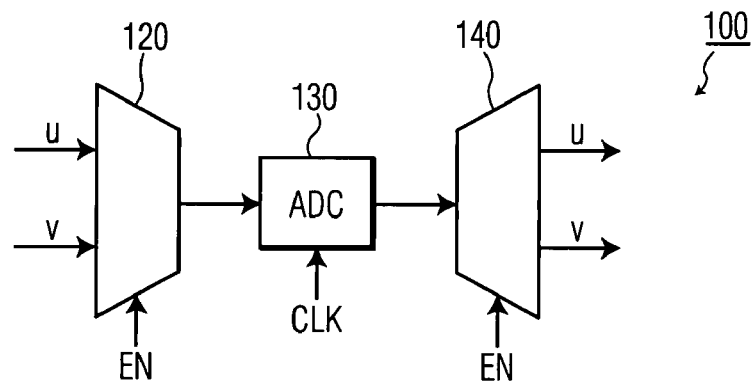
FIG. 1 is a diagram of a multiplexed ADC arrangement employing a simple multiplexing technique.
Figure 2:
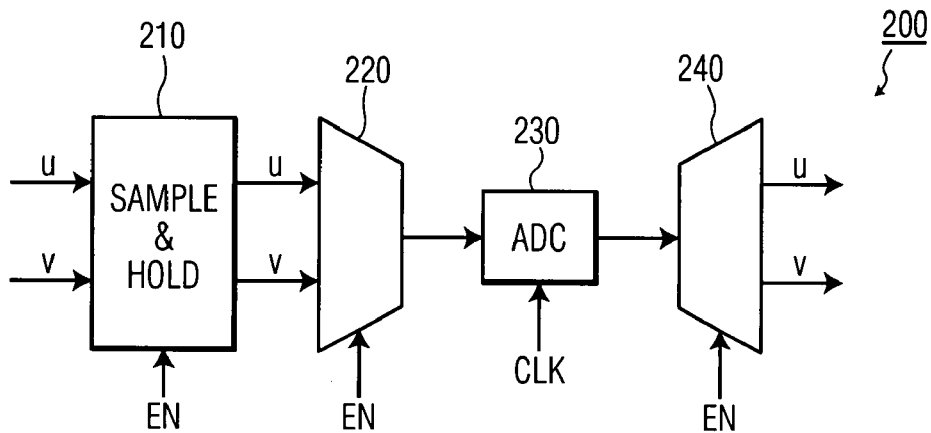
FIG. 2 is a diagram of a multiplexed ADC arrangement employing a sample-and-hold circuit.
Figure 3:
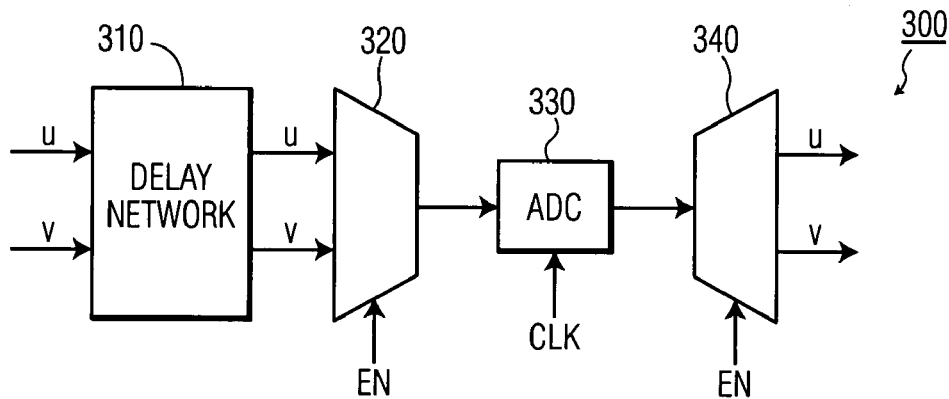
FIG. 3 is a diagram of a multiplexed ADC arrangement employing an analog delay filter.
Figure 4:
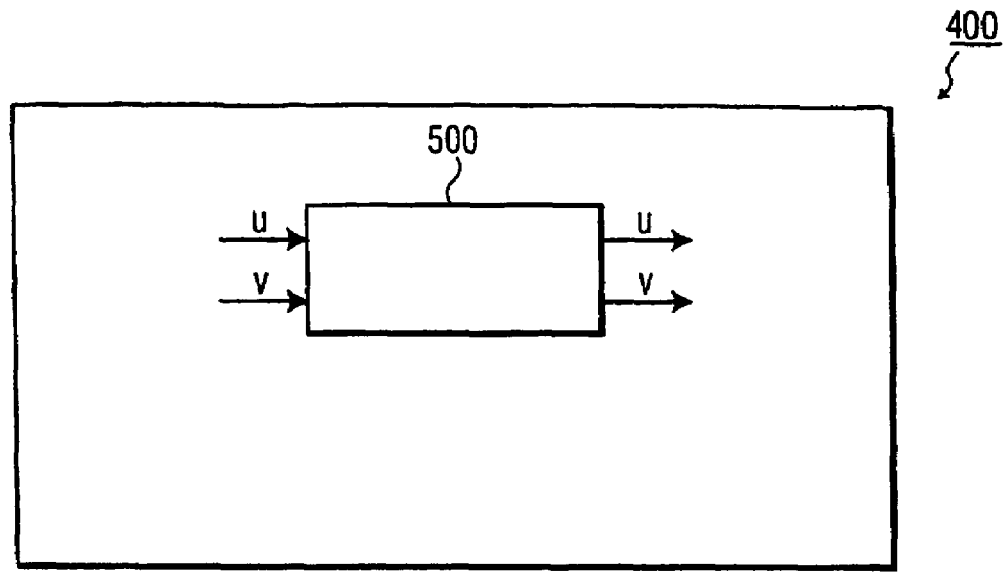
FIG. 4 is a diagram of an exemplary system including a multiplexed ADC arrangement according to principles of the present invention.

Referring now to FIG. 4, a diagram of an exemplary system 400 including a multiplexed ADC arrangement 500 according to principles of the present invention is shown. System 400 of FIG. 4 may be embodied as an audio and/or video system, such as a television signal receiver, a set-top box, video cassette recorder ("VCR"), digital versatile disk ("DVD") player, video game box, personal video recorder ("PVR") or other video and/or audio system.

In FIG. 4, system 400 includes multiplexed ADC arrangement 500 which enables its ADC (not expressly shown in FIG. 4) to be time-shared between input signals, U and V, and further enables such signals to be time-aligned when output. The U and V input signals may represent, for example, color difference signals in a digital video system, such as a high-definition television ("HDTV") system or the like. Multiplexed ADC arrangement 500 may, for example, be embodied on an IC. Although not expressly shown in FIG. 4, system 400 may also include other components, such as other ICs and other electrical and non-electrical components.

Figure 5:
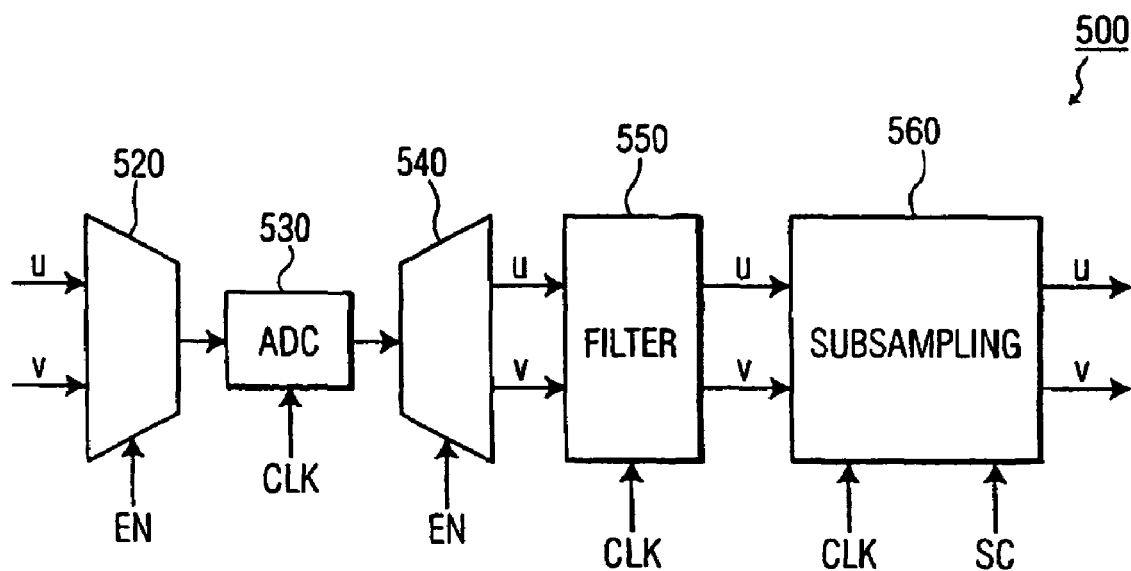
FIG. 5 is a diagram providing further details of the multiplexed ADC arrangement of FIG. 4.

Referring now to FIG. 5, a diagram providing further details of multiplexed ADC arrangement 500 of FIG. 4 is shown. As shown in FIG. 5, multiplexed ADC arrangement 500 comprises a multiplexer 520, an ADC 530, a demultiplexer 540, a filter 550, and a subsampling device 560. As will be explained hereinafter, multiplexed ADC arrangement 500 provides time-aligned output signals without using an analog delay device prior to ADC 530.

In operation, multiplexer 520 simultaneously receives analog U and V input signals, and is switched in dependence upon the EN signal to output selected ones of the received analog U and V signals in an alternating manner. ADC 530 receives the analog U and V output signals from multiplexer 520, and digitizes the received U and V signals in dependence upon the CLK signal, wherein each interval of the CLK signal defines a single clock cycle or time interval. The EN and CLK signals may be generated by a clock generator or other device (not shown). According to an exemplary embodiment, the frequency of the CLK signal in FIG. 5 is two times the frequency of the EN signal. For example, the CLK signal may exhibit a frequency of 18 MHz, while the EN signal may exhibit a frequency of 9 MHz. Accordingly, ADC 530 receives and digitizes only every other U and V signal input to multiplexer 520. That is, multiplexer 520 is switched such that every other U and V signal input to multiplexer 520 is lost. In this manner, ADC 530 outputs a digitized U signal during one clock cycle, and outputs a digitized V signal during the next clock cycle. Further details regarding this operation will be provided later herein.

Demultiplexer 540 receives the digital U and V signals output from ADC 530, and is switched in dependence upon the EN signal to output the digital U and V signals. As will be explained later herein, demultiplexer 540 produces both a digital U output signal and a digital V output signal during each clock cycle. One of these digital U and V output signals is a signal provided from ADC 530 during the current clock cycle, while the other of these digital U and V signals was provided from ADC 530 during a previous (e.g., immediately preceding) clock cycle. According to an exemplary embodiment, demultiplexer 540 holds previous U and V signal values such that it produces a current U output signal and a previous V output signal during one clock cycle, and then produces a previous U output signal and a current V output signal during the next clock cycle.

Filter 550 receives the digital U and V signals from demultiplexer 540, and performs a filtering (e.g., interpolating) operation thereon to thereby output time-aligned, filtered U and V signals in dependence upon the CLK signal. In particular, the filtered U and V signals produced by filter 550 are time-aligned relative to the corresponding input signals to multiplexer 520. In FIG. 5, filter 550 is shown as a single filtering device for operating upon both the U and V signal channels. In practicing the invention, however, filter 550 may be comprised of multiple filtering devices, such as a dedicated filter for each signal channel. Accordingly, filter 550 comprises at least one filtering device. According to an exemplary embodiment, filter 550 performs the filtering operations such that each U signal value is set equal to one half the U signal value received from demultiplexer 540 during the current clock cycle, plus one half the U signal value received from demultiplexer 540 during a previous (e.g., immediately preceding) clock cycle. Similarly, each V signal value is set equal to one half the V signal value received from demultiplexer 540 during the current clock cycle, plus one half the V signal value received from demultiplexer 540 during a previous (e.g., immediately preceding) clock cycle. Further details regarding this filtering operation will be provided later herein.

Subsampling device 560 receives the time-aligned, filtered U and V signals from filter 550, and performs a subsampling operation thereon to output subsampled U and V signals in a time-aligned manner in dependence upon the CLK signal and a subsample control ("SC") signal. The SC signal controls the frequency at which subsampling device 560 performs subsampling. For example, the SC signal may cause subsampling device 560 to perform subsampling upon a pair of filtered U and V signals every other clock cycle. The time-aligned U and V output signals from subsampling device 560 are then provided for further processing, such as color correction, tint correction, sample rate conversion, and/or other processing operation. Like filter 550, subsampling device 560 is shown in FIG. 5 as a single subsampling device for operating upon both the U and V signal channels. In practicing the invention, however, subsampling device 560 may be comprised of multiple subsampling devices, such as a dedicated subsampling device for each signal channel. Accordingly, subsampling device 560 comprises at least one subsampling device.

Referring to Table 4 below, further details regarding an exemplary operation of multiplexed ADC arrangement 500 will now be provided.

TABLE 4

|  | Clock Cycle | | | | |
| --- | --- | --- | --- | --- | --- |
|  | 1 | 2 | 3 | 4 | 5 |
| Analog U | 45 | 46 | 47 | 48 | 49 |
| Analog V | 75 | 76 | 77 | 78 | 79 |
| Mux Position | U | V | U | V | U |
| ADC Output | 45 | 76 | 47 | 78 | 49 |
| Demuxed U | 45 | 45 | 47 | 47 | 49 |
| Demuxed V | — | 76 | 76 | 78 | 78 |
| Filtered U | — | 45 | 46 | 47 | 48 |
| Filtered V | — | — | 76 | 77 | 78 |

As indicated in Table 4, analog U and V signals (i.e., Analog U and Analog V) are simultaneously input to multiplexer 520 during each clock cycle. The switching position of multiplexer 520 (i.e., Mux Position) changes from U to V in an alternating manner from one clock cycle to another. In Table 4 for example, multiplexer 520 is switched to output an analog U signal having a value of 45 during clock cycle 1, and is switched to output an analog V signal having a value of 76 during clock cycle 2. Note also in Table 4 that certain U and V input signals to multiplexer 520 are lost. For example, during clock cycle 1, the V signal having a value of 75 is lost. Similarly, during clock cycle 2, the U signal having a value of 46 is lost. As will be indicated later herein, these lost signals are compensated for by the operation of filter 550.

ADC 530 receives the analog U and V output signals from multiplexer 520, and digitizes the received U and V signals in dependence upon the CLK signal. Since multiplexer 520 is switched such that every other U and V signal input to multiplexer 520 is lost, ADC 530 receives and digitizes only every other U and V signal input to multiplexer 520. For purposes of example and explanation, Table 4 illustrates ADC 530 as having a zero latency or delay between input and output. That is, Table 4 depicts ADC 530 as producing a digital U or V output signal (i.e., ADC Output) during the same clock cycle that it receives a corresponding analog U or V input signal from multiplexer 520. In practicing the invention, however, there may be some delay between the time at which ADC 530 receives an analog U or V input signal from multiplexer 520, and the time at which ADC 530 produces a corresponding digital U or V output signal. For example, such delay may be equal to one or more clock cycles.

Demultiplexer 540 receives the digitally converted U and V signals from ADC 530, and is switched in dependence upon the EN signal to simultaneously output digital U and V signals. Again, for purposes of example and explanation, Table 4 illustrates demultiplexer 540 as having a zero delay between input and output. Accordingly, Table 4 depicts demultiplexer 540 as producing a current U or V output signal (i.e., Demuxed U or Demuxed V) during the same clock cycle that it receives the current U or V signal from ADC 530. In practicing the invention, however, there may be some delay between the time at which demultiplexer 540 receives a U or V input signal from ADC 530, and the time at which demultiplexer 540 produces the U or V output signal. For example, such delay may be equal to one or more clock cycles.

As previously indicated herein, demultiplexer 540 produces both a digital U output signal and a digital V output signal during each clock cycle. In particular, demultiplexer 540 holds previous U and V signal values such that it produces a current U output signal and a previous V output signal during a given clock cycle, and then produces a previous U output signal and a current V output signal during the next clock cycle. For example, during clock cycle 3 in Table 4, demultiplexer 540 produces the current U output signal having a value of 47, and the V output signal of the immediately preceding clock cycle (i.e., clock cycle 2) having a value of 76. Then, during clock cycle 4, demultiplexer 540 produces the current V output signal having a value of 78, and the U output signal of the immediately preceding clock cycle (i.e., clock cycle 3) having a value of 47. In this manner, demultiplexer 540 produces both a digital U output signal and a digital V output signal during each clock cycle.

Filter 550 receives the digital U and V signals from demultiplexer 540, and performs a filtering operation thereon to thereby output time-aligned, filtered U and V signals. As previously indicated herein, filter 550 performs the filtering operation according to an exemplary embodiment such that each U signal value is set equal to one half the U signal value provided from demultiplexer 540 during the current clock cycle, plus one half the U signal value provided from demultiplexer 540 during a previous (e.g., immediately preceding) clock cycle. Similarly, each V signal value is set equal to one half the V signal value provided from demultiplexer 540 during the current clock cycle, plus one half the V signal value provided from demultiplexer 540 during a previous (e.g., immediately preceding) clock cycle. For example, during clock cycle 3 in Table 4, filter 550 outputs a filtered U signal (i.e., Filtered U) having a value of 46, and a filtered V signal (i.e., Filtered V) having a value of 76. The value of 46 for the filtered U signal is derived as follows:

$$\frac{1}{2}(47)+\frac{1}{2}(45)=46$$

That is, for clock cycle 3 in Table 4, the filtered U signal is equal to one half the U signal value (i.e., 47) provided from demultiplexer 540 during the current clock cycle (i.e., clock cycle 3), plus one half the U signal value (i.e., 45) provided from demultiplexer 540 during the immediately preceding clock cycle (i.e., clock cycle 2). Similarly, the value of 76 for the filtered V signal is derived as follows:

$$\frac{1}{2}(76)+\frac{1}{2}(76)=76$$

That is, for clock cycle 3 in Table 4, the filtered V signal is equal to one half the V signal value (i.e., 76) provided from demultiplexer 540 during the current clock cycle (i.e., clock cycle 3), plus one half the V signal value (i.e., 76) provided from demultiplexer 540 during the immediately preceding clock cycle (i.e., clock cycle 2). Of course, filter 550 may perform other types of filtering operations in accordance with the principles of the present invention. For example, filter 550 may generate filtered U and V signals by utilizing signal values from previous clock cycles other than the immediately preceding clock cycle.

Subsampling device 560 receives the time-aligned, filtered U and V signals from filter 550, and performs a subsampling operation thereon to generate subsampled U and V signals. Although not expressly shown in Table 4, subsampling device 560 outputs the subsampled U and V signals in a time-aligned manner during a subsequent clock cycle in dependence upon the CLK signal and the SC signal. As previously indicated herein, the subsampled U and V signals are provided for further processing, such as color correction, tint correction, sample rate conversion, and/or other processing operation.

Figure 6:
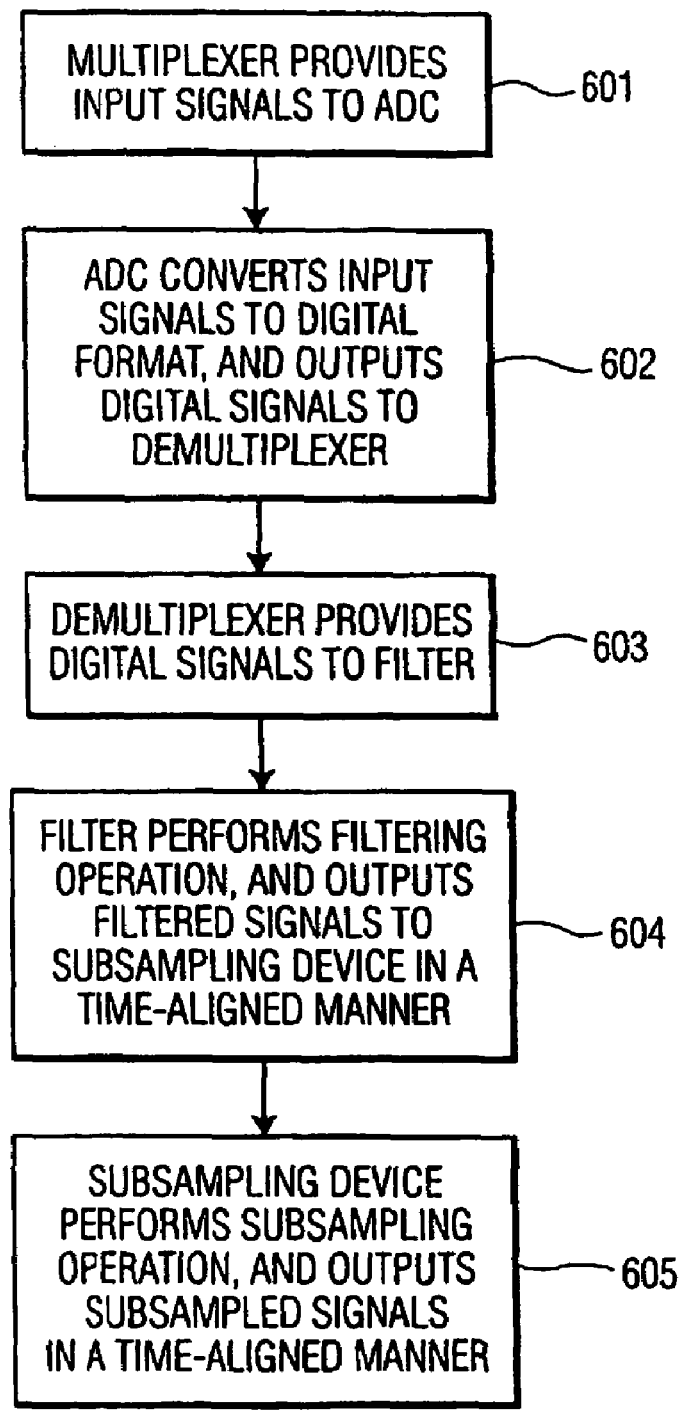
FIG. 6 is a flowchart summarizing exemplary steps for carrying out the present invention.

Referring now to FIG. 6, a flowchart 600 summarizing exemplary steps for carrying out the present invention is shown. For purposes of example and explanation, the steps of FIG. 6 will be described with reference to multiplexed ADC arrangement 500 of FIG. 5.

In FIG. 6, process flow begins at step 601 where multiplexer 520 provides analog U and V input signals to ADC 530 in an alternating manner in dependence upon the EN signal. At step 602, ADC 530 converts the analog U and V input signals to a digital format, and outputs digital U and V signals to demultiplexer 540 in dependence upon the CLK signal, wherein each interval of the CLK signal defines a single clock cycle or time interval. At step 603, demultiplexer 540 in turn provides the digital U and V signals to filter 550 in dependence upon the EN signal. At step 604, filter 550 performs a filtering (e.g., interpolating) operation on the digital U and V signals provided from demultiplexer 540, and outputs filtered U and V signals to subsampling device 560 in a time-aligned manner in dependence upon the CLK signal. Then, at step 605, subsampling device 560 performs a subsampling operation on the filtered U and V signals provided from filter 550, and outputs subsampled U and V signals in a time-aligned manner. The time-aligned U and V output signals from subsampling device 560 are then provided for further processing, such as color correction, tint correction, sample rate conversion, and/or other processing operation.

As described herein, the present invention advantageously eliminates analog delay means in a multiplexed ADC system that provides time-aligned output samples. Although the preferred embodiments have been described herein with reference to only two input signals (i.e., U and V), it will be intuitive to those skilled in the art that the principles of the present invention may be applied to systems having more than two input signals. Accordingly, the principles of the present invention may be applied to provide any number of signal channels with time-aligned output signals.

The present invention described herein is particularly applicable to various audio and/or video systems, either with or without display devices. Accordingly, the phase "audio and/or video system" or similar phases as used herein are intended to encompass various types of systems or apparatuses including, but not limited to, television sets or monitors that include a display device, and systems or apparatuses such as a set-top box, VCR, DVD player, video game box, PVR or other video system that may not include a display device. Moreover, the present invention may also be applicable to other systems, such as audio systems that may or may not have a video output.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A system, comprising:
an analog-to-digital converter for converting first and second analog signals which are time aligned during successive intervals to first and second digital signals, respectively, and for outputting the first digital signal during a first time interval and outputting the second digital signal during a second time interval; and
a digital filter for filtering the first and second digital signals to generate first and second filtered signals, respectively, and outputting the first and second filtered signals in a time-aligned manner during successive time intervals.

2. The system of claim 1, further comprising a multiplexer for providing the first and second analog signals to the analog-to-digital converter.

3. The system of claim 1, further comprising a demultiplexer-for receiving the first and second digital signals from the analog-to-digital converter, and providing the first and second digital signals to the digital filter.

4. The system of claim 1, further comprising at least one subsampling device for performing a subsampling operation upon the first and second filtered signals to generate first and second subsampled signals, respectively, and for outputting the first and second subsampled signals in a time-aligned manner.

5. The system of claim 4, wherein the time intervals each correspond to a single clock cycle.

6. The system of claim 1, wherein:
the system is a digital video system; and
the first and second digital signals are color difference signals.

7. An apparatus, comprising:
analog-to-digital conversion means for converting first and second time aligned analog signals to first and second digital signals, respectively, and for outputting the first digital signal during a first time interval and outputting the second digital signal during a second time interval; and
digital filtering means for filtering the first and second digital signals to generate first and second filtered signals, respectively, and for outputting the first and second filtered signals in a time-aligned manner during successive time intervals.

8. The apparatus of claim 7, further comprising multiplexing means for providing the first and second analog signals to the analog-to-digital conversion means.

9. The apparatus of claim 7, further comprising demultiplexing means for receiving the first and second digital signals from the analog-to-digital conversion means, and providing the first and second digital signals to the filtering means.

10. The apparatus of claim 7, further comprising subsampling means for performing a subsampling operation upon the first and second filtered signals to generate first and second subsampled signals, respectively, and for outputting the first and second subsampled signals in a time-aligned manner.

11. The apparatus of claim 10, wherein the time intervals each correspond to a single clock cycle.

12. The apparatus of claim 7, wherein:
the apparatus is included in a digital video system; and the first and second digital signals are color difference signals.

13. A method for processing signals in a system, comprising steps of:
converting first and second time aligned analog signals to first and second digital signals, respectively;
outputting the first digital signal during a first time interval;
outputting the second digital signal during a second time interval;
filtering the first and second digital signals to generate first and second filtered signals, respectively; and
outputting the first and second filtered signals in a time-aligned manner during successive time intervals.

14. The method of claim 13, further comprising a step of multiplexing the first and second analog signals prior to the converting step.

15. The method of claim 13, further comprising a step of demultiplexing the first and second digital signals prior to the filtering step.

16. The method of claim 13, further comprising steps of:
performing a subsampling operation upon the first and second filtered signals to generate first and second subsampled signals, respectively; and
outputting the first and second subsampled signals in a time-aligned manner.

17. The method of claim 16, wherein said time intervals each correspond to a single clock cycle.

18. The method of claim 13, wherein:
the system comprises a digital video system; and
the first and second digital signals are color difference signals.

* * * * *